US009035247B2

(12) United States Patent
Paluszynski

(10) Patent No.: US 9,035,247 B2
(45) Date of Patent: May 19, 2015

(54) METHOD FOR OPERATING A PARTICLE BEAM DEVICE AND/OR FOR ANALYZING AN OBJECT IN A PARTICLE BEAM DEVICE

(71) Applicant: Carl Zeiss Microscopy GmbH, Jena (DE)

(72) Inventor: Jaroslaw Paluszynski, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/041,000

(22) Filed: Sep. 30, 2013

(65) Prior Publication Data

US 2014/0158884 A1    Jun. 12, 2014

(30) Foreign Application Priority Data

Sep. 29, 2012    (DE) .................... 10 2012 109 296

(51) Int. Cl.
| H01J 37/00 | (2006.01) |
| H01J 37/22 | (2006.01) |
| H01J 37/26 | (2006.01) |
| H01J 37/28 | (2006.01) |

(52) U.S. Cl.
CPC .............. *H01J 37/222* (2013.01); *H01J 37/26* (2013.01); *H01J 37/28* (2013.01)

(58) Field of Classification Search
USPC ........................................................ 250/307
See application file for complete search history.

(56) References Cited

U.S. PATENT DOCUMENTS

| 4,912,313 A   | 3/1990  | Kato et al.              |
| 5,001,344 A   | 3/1991  | Kato et al.              |
| 5,729,584 A * | 3/1998  | Moorman et al. ....... 378/146 |
| 6,907,140 B2* | 6/2005  | Matsugu et al. ........ 382/195 |
| 7,113,632 B2* | 9/2006  | Lee et al. ............ 382/154 |

OTHER PUBLICATIONS

S. Roy et al., "Automatic 3D reconstruction of quasi-planar stereo Scanning Electron Microscopy (SEM) images," *Engineering in Medicine and Biology Society(EMBC)*, 34th Annual Intl. Conference of the IEEE, Aug. 28-Sep. 1, 2012, pp. 4361-4364.
A. Kayaalp et al., "Using SEM stereo to extract semiconductor wafer pattern topography," *Microlithography Conference. International Society for Optics and Photonics*, 1987, pp. 18-26.
J. Xie, "Stereomicroscopy: 3D Imaging and the Third Dimension Measurement," Application Note, Agilent Technologies, Sep. 19, 2011, 8 pp.
G. Piazzesi, "Photogrammetry with the scanning electron microscope," *Journal of Physics E: Scientific Instruments 6.4*, 1973, pp. 392-396.
A. Kayaalp, "Scanning electron microscope-based stereo analysis," *Machine Vision and Applications 3.4*, 1990, pp. 231-246.
G. Lane, "The application of stereographic techniques to the scanning electron microscope," *Journal of Physics E: Scientific Instruments 2.7*, 1969, pp. 565-569.
F. Marinello et al., "Critical factors in SEM 3D stereo microscopy," *Measurement Science and Technology 19.6*, 2008, 065705, pp. 1-12.

\* cited by examiner

*Primary Examiner* — Phillip A Johnston
(74) *Attorney, Agent, or Firm* — Muirhead and Saturnelli, LLC

(57) ABSTRACT

A method for operating a particle beam device and/or for analyzing an object in a particle beam device are provided. For example, the particle beam device is an electron beam device, an ion beam device, or a combination device having an electron beam device and an ion beam device. In various embodiments, the method steps of a so-called stereoscopy method and a multi-detector method may be combined with one another in such a manner that simple and rapid analysis of the object is made possible.

23 Claims, 12 Drawing Sheets

METHOD FOR OPERATING A PARTICLE BEAM DEVICE AND/OR FOR ANALYZING AN OBJECT IN A PARTICLE BEAM DEVICE

TECHNICAL FIELD

This application relates to a method for operating a particle beam device and/or for analyzing an object in a particle beam device. For example, the particle beam device is an electron beam device, an ion beam device, or a combination device having an electron beam device and an ion beam device.

BACKGROUND OF THE INVENTION

Electron beam devices, in particular a scanning electron microscope (SEM) or a transmission electron microscope (TEM), and/or ion beam devices, in particular a so-called "focused ion beam" (FIB) device, are used to study objects, in order to obtain findings with respect to the properties and behaviors of these objects under specific conditions.

An SEM has an electron beam column, in which a beam generator and an objective lens are arranged. An electron beam is generated by means of the beam generator and focused by the objective lens on an object to be studied. By means of a deflection apparatus, the electron beam (also referred to hereafter as a primary electron beam) is guided in a grid over the surface of the object to be studied. The electrons of the primary electron beam interact with the object. As a result of the interaction, electrons in particular are emitted from the object (so-called secondary electrons) or electrons of the primary electron beam are backscattered (so-called backscatter electrons). Secondary electrons and backscatter electrons form the so-called secondary beam and are detected using a detector. The detector signal generated in this way is used for image generation, for example.

The image obtained using the SEM is a two-dimensional representation of a surface of the object to be studied. To calculate a three-dimensional representation of the object from the two-dimensional representation, two methods are known from the prior art, firstly the so-called stereoscopy method and secondly the so-called multi-detector method.

In the stereoscopy method, an object is positioned in a first position relative to a particle beam. Subsequently thereto, a particle beam is guided onto the object and interaction particles are detected, wherein the detection signals thus obtained are used to generate a first image of the object. Subsequently thereto, the object is moved into a second position relative to the particle beam. This second position is distinguished in that it is typically arranged tilted by 3° to 8° relative to the first position. The particle beam is then in turn guided onto the object and interaction particles are detected to generate a second image of the object. In the stereoscopy method, an algorithm is now used, which identifies first points in the first image and second points, which are identical to the first points, in the second image. Furthermore, the lateral distance of each first point to its associated second point is calculated. Since the first image and the second image are recorded from different positions, the lateral distance (i.e., the difference of the two actually identical points) is not necessarily zero, but rather differs from zero. By means of the lateral distances obtained in this way, by means of the known set angle of the first position relative to the second position, and further geometrically known specifications, it is then possible to calculate extents on the object at the first points or the second points, respectively, in a z-direction.

As explained above, the stereoscopy method is based on the fact that corresponding points are ascertained in the first image and in the second image of the object. This can restrict the application of this method to objects in which a network having differentiable points can be identified and used. Furthermore, it is advisable that eucentric movements are used for positioning the object in the first position and/or the second position.

A further method for generating a three-dimensional illustration of an object by means of a particle beam device is the so-called multi-detector method. In the multi-detector method, in contrast to the stereoscopy method, a particle beam is not fed to the object at various angles, but rather images are prepared by means of a particle beam while employing a plurality of detectors, wherein these detectors are arranged symmetrically about an optical axis of a primary electron beam incident on the object. For example, four detectors are used, which each generate one image of the object. By means of the four generated images, slopes along a first axis (x-axis) and along a second axis (y-axis) are determined on every pixel of a studied surface of the object. By integration of the slopes along the first axis and the second axis, a grid of profiles is obtained, which can be assembled to form a three-dimensional model of the object.

In the multi-detector method, it is disadvantageous that the method is substantially only suitable for objects wherein the surfaces to be studied are continuous and do not have large overlaps of structures, since interaction particles, in the case of a specific angular irradiation, are shielded by such structures from a detector and do not reach the detector.

With respect to the prior art, reference is made, for example, to U.S. Pat. No. 4,912,313 A and to U.S. Pat. No. 5,001,344 A.

Accordingly, it would be desirable to specify a method for operating a particle beam device and/or for analyzing an object in a particle beam device, which is simple and relatively rapid to carry out, in such a manner that a three-dimensional representation of an object is obtained relatively rapidly.

SUMMARY OF THE INVENTION

According to the system described herein, a method for operating a particle beam device and/or for analyzing an object using a particle beam device, for example, an SEM, is provided, the method including a plurality of method parts, specifically at least one first method part, at least one second method part, at least one third method part, and at least one fourth method part. The above-mentioned method parts are explained hereafter. It is already to be noted now that the above-mentioned method parts and/or individual steps of the method parts can run successively, in a different sequence, or else in parallel to one another with respect to time. The method according to the system described herein is used in particular for generating a three-dimensional representation of an object.

The first method part comprises a method which is based on the stereoscopy method.

An object is positioned in a first position relative to a particle beam. Subsequently thereto, the particle beam is guided onto the object. The interaction particles and/or interaction radiation arising upon incidence of the particle beam on the object are/is used to generate a first image of the object. Subsequently thereto, further positioning of the object is performed into a second position relative to the particle beam. For example, the second position is arranged tilted by 3° to 8° relative to the first position. Feeding of the particle beam to the object is then again performed. The interaction particles arising and/or interaction radiation arising upon the incidence of the particle beam are/is used to generate a second image of the object.

In further steps, locations, which are associated with one another and correspond to one another, are now determined in the first image and in the second image. In other words, a location is identified in the first image, which is also visible in the second image. Therefore, at least one first location is determined in the first image, which is provided by a first coordinate along a first coordinate axis (for example, a x-axis) and by a second coordinate along a second coordinate axis (for example, a y-axis). The first coordinate axis and the second coordinate axis enclose an angle, which is different from 0° and 180°, with one another. Then, at least one second location is determined in the first image, which is provided by a third coordinate along the first coordinate axis and by a fourth coordinate along the second coordinate axis. At least one third location is determined in the second image, which is provided by a fifth coordinate along the first coordinate axis and by a sixth coordinate along the second coordinate axis, wherein the third location in the second image corresponds to the first location in the first image. A fourth location is also determined in the second image, which is provided by a seventh coordinate along the first coordinate axis and by an eighth coordinate along the second coordinate axis, wherein the fourth location in the second image corresponds to the second location in the first image.

Furthermore, it is provided that a first lateral distance of the first location to the third location is determined. In other words, the relative distance (lateral distance) of the same location, which is imaged in the two different images (specifically the first image and the second image) and is visible, is determined. Since the first image and the second image are recorded in different positions relative to the particle beam, the relative distance of the same location in the two different images is not necessarily zero. Rather, it is typically different from zero. Furthermore, a second lateral distance between the second location and the fourth location is determined. The statement made above with respect to the lateral distance applies correspondingly here. In a further step, a first extent of the object at the first location along a third coordinate axis (for example, a z-axis) is then determined by means of the first lateral distance. Furthermore, a second extent of the object at the second location along the third coordinate axis is determined by means of the second lateral distance. The third coordinate axis encloses a second angle, which is different from 0° and 180°, with the first coordinate axis. Furthermore, the third coordinate axis encloses a third angle, which is different from 0° and 180°, with the second coordinate axis.

In a further step, a preparation of a three-dimensional map of the object is performed, wherein the first extent at the first location and the second extent at the second location are recorded in the three-dimensional map. In this manner, at least two points in the three-dimensional map are determined. A first number tuple composed of the coordinates of the first location and the first extent then determines a first point. Furthermore, a second number tuple composed of the coordinates of the second location and the second extent determines a second point. Accordingly, specific points on a surface of the object are determined using the first method part.

The second method part comprises a method which is based on the multi-detector method.

Object images are recorded of the object by means of various detector units arranged symmetrically about an optical axis, along which the particle beam runs. This is done by scanning the particle beam over the object, for example. Because of interactions of the particle beam with the object, in particular, particles emitted by the object (secondary particles) and particles backscattered on the object (backscatter particles) arise. For example, the secondary particles are secondary electrons. The backscatter particles are backscatter electrons, for example. The secondary particles and/or the backscatter particles are detected using the detector units. Detector signals resulting therefrom are used to generate object images of the object. Thus, a first object image is determined using at least one first detector unit. Furthermore, a determination of a second object image using at least one second detector unit, a determination of a third object image using at least one third detector unit, and a determination of a fourth object image using at least one fourth detector unit are performed. The first detector unit, the second detector unit, the third detector unit, and the fourth detector unit are arranged symmetrically about the object. They can be provided by individual detectors or by one segmented detector. In one embodiment of the method according to the system described herein, it is provided that the above-mentioned object images are to be determined successively. In contrast, in an alternative embodiment of the method according to the system described herein, it is provided that the above-mentioned object images are determined simultaneously during scanning of the particle beam over the surface of the object.

In a further step, a determination of a profile of a surface of the object and a generation of a three-dimensional representation of the object by means of the first object image, the second object image, the third object image, and the fourth object image are performed.

A continuous profile of the surface of the object is generated using the second method part.

The method according to the system described herein also comprises a third method part, which has the following method steps. The three-dimensional representation is thus displaced along the third coordinate axis (z-axis), until a first pixel of the three-dimensional representation lies on the first point. Furthermore, a generation of a calculated three-dimensional representation of the object is performed by adapting slopes of the three-dimensional representation of the second method part at a predefined number of pixels of the three-dimensional representation of the second method part in such a manner that the surface of the object runs through the first point and through the second point.

The third method part accordingly comprises reconciling the points determined using the first method part with the profile of the surface of the object determined in the second method part, and specifically in three dimensions. In other words, the points determined in the first method part are transformed into the profile of the surface of the object determined in the second method part. However, this can also occur inversely. Accordingly, the profile of the surface determined during the second method part is transformed with respect to the position of the points determined during the first method part.

In the third method part, any suitable transformation for three-dimensional adaptation of the surface, which was determined by the second method part, can be used, for example a linear transformation or a nonlinear transformation. For example, regression methods can also be used, in particular a linear regression, a quadratic regression, or a regression of another power, or else methods for weighted averaging.

In the fourth method part, an analysis of the three-dimensional representation of the object calculated in the third method part is then performed.

The system described herein is based on the surprising finding that a three-dimensional representation of an object can thus be generated more rapidly by imaging by means of a particle beam device if the method steps of the stereoscopy method and of the multi-detector method are executed successively and/or in parallel to one another with respect to time. The finding is based on the idea, for example, of firstly determining a three-dimensional map, which is not very detailed, of points of the object employing the stereoscopy method. A continuous profile of the surface of the object is then determined by means of the multi-detector method for a predefined number of pixels. The number of the pixels can be significantly less than the number of the pixels which is used in the prior art. For example, the number of the pixels can be reduced in comparison to the prior art by a factor of 5 to 30. Subsequently thereto, the transformation already explained above is performed. The surprising finding is based in particular on the fact that discrete points (first method part) can be combined and reconciled with a continuous profile of the surface (second method part), to thus achieve a rapidly achievable three-dimensional representation of the object.

As already mentioned above, the sequence of the performance of the first method part and the second method part is not fixed. Thus, firstly the first method part and then subsequently the second method part can be performed. In an alternative embodiment of the method according to the system described herein, it is provided that firstly the second method part and then subsequently the first method part is to be performed. In a further embodiment of the method according to the system described herein, it is alternatively provided that at least some method steps, including all method steps, of the first method part and of the second method part are to be executed in parallel to one another with respect to time.

In one embodiment of the method according to the system described herein, it is additionally or alternatively provided that, during the analysis of the three-dimensional representation of the object, which is calculated in the third method part, the three-dimensional representation of the object, which is calculated in the third method part, is displayed on a display unit of the particle beam device and/or data of the three-dimensional representation of the object, which is calculated in the third method step, are stored in a storage unit.

In a further embodiment of the method according to the system described herein, it is additionally or alternatively provided that, during the analysis of the three-dimensional representation of the object, which is calculated in the third method part, the three-dimensional representation of the object, which is calculated in the third method part, is compared to predefined data of the object. For example, the predefined data are data which were already obtained by further measurements on the object.

In one embodiment of the method according to the system described herein, it is additionally or alternatively provided that a plurality of first points and a plurality of second points are determined by means of the first method part. Furthermore, the profile of the surface of the object is determined in a surface region which is spanned by at least three of the plurality of first points and/or of the plurality of second points. This embodiment of the method according to the system described herein is suitable in particular for objects which have a plurality of easily identifiable points. These points are identified using the first method part. Furthermore, the profile of the surface is determined in regions which are spanned by at least three of the plurality of first points and/or the plurality of second points. Subsequently thereto, the adaptation already explained is performed.

In a further embodiment of the method according to the system described herein, it is provided in particular for objects which only have a few easily identifiable points on the surface thereof (for example, because of a very smooth surface) to firstly determine the profile of the surface of the object by means of the second method part. Subsequently thereto, the determination of points by means of the first method part is performed. The transformation already discussed above is then performed.

In a further embodiment of the method according to the system described herein, the first coordinate axis, the second coordinate axis, and/or the third coordinate axis are arranged perpendicularly to one another. It is explicitly noted, however, that the system described herein is not necessarily restricted to this arrangement. Rather, the first angle, the second angle, and/or the third angle can assume any suitable angle, as long as each of these is not equal to 0° and 180°. Accordingly, two of the three coordinate axes are not aligned parallel or antiparallel to one another.

As already mentioned above, in a further embodiment of the method according to the system described herein, it is additionally or alternatively provided that the first object image, the second object image, the third object image, and the fourth object image are generated simultaneously by scanning a surface of the object using the particle beam.

In still a further embodiment of the method according to the system described herein, it is additionally or alternatively provided that the first image of the object is generated simultaneously with at least one of the following object images, specifically the first object image, the second object image, the third object image, and the fourth object image. Additionally or alternatively thereto, it is provided that the second image of the object is generated simultaneously with at least one of the following object images, specifically the first object image, the second object image, the third object image, and the fourth object image.

In a further embodiment of the method according to the system described herein, in the first method part, in place of the first lateral distance and the second lateral distance, distance differences between image points, which are associated with the same object points, in the first image and in the second image are determined. Furthermore, in the first method part, the first extent and the second extent of the object are determined on the basis of the previously determined distance differences.

The system described herein also relates to a computer program product, which has a program code, which is loadable (or is loaded) in a control processor of a particle beam device and which controls the particle beam device, during an execution in the control processor, in such a manner that a method having at least one of the above-mentioned features or a combination of at least two of the above-mentioned features is carried out.

The system described herein also relates to a particle beam device, which has at least one beam generator for generating a particle beam and also at least one objective lens for focusing the particle beam on an object. Furthermore, the particle beam device has at least one detector, which detects interaction particles and/or interaction radiation, which are generated by incidence of the particle beam on the object. The detector is segmented, for example, and has at least four detector units, specifically a first detector unit, a second detector unit, a third detector unit, and a fourth detector unit. Alternatively thereto, it is provided that at least four detectors, which are independent of one another, are provided. Furthermore, the particle beam device has at least one control processor, which has a computer program product, which has at least one of the above-mentioned features or a combination of at least two of the above-mentioned features. The particle beam device according to the system described herein is, for example, an SEM. However, the system described herein is not restricted to such a particle beam device. Rather, the particle beam device can also be implemented as any other particle beam device, for example any further electron beam device or ion beam device.

As already stated above, the above-explained method is used in one embodiment of the system described herein to generate a three-dimensional representation of an object using a particle beam device.

BRIEF DESCRIPTION OF THE DRAWINGS

The system described herein will be described in detail hereafter on the basis of exemplary embodiments by means of figures. In the figures.

DETAILED DESCRIPTION OF VARIOUS EMBODIMENTS

Figure 1:
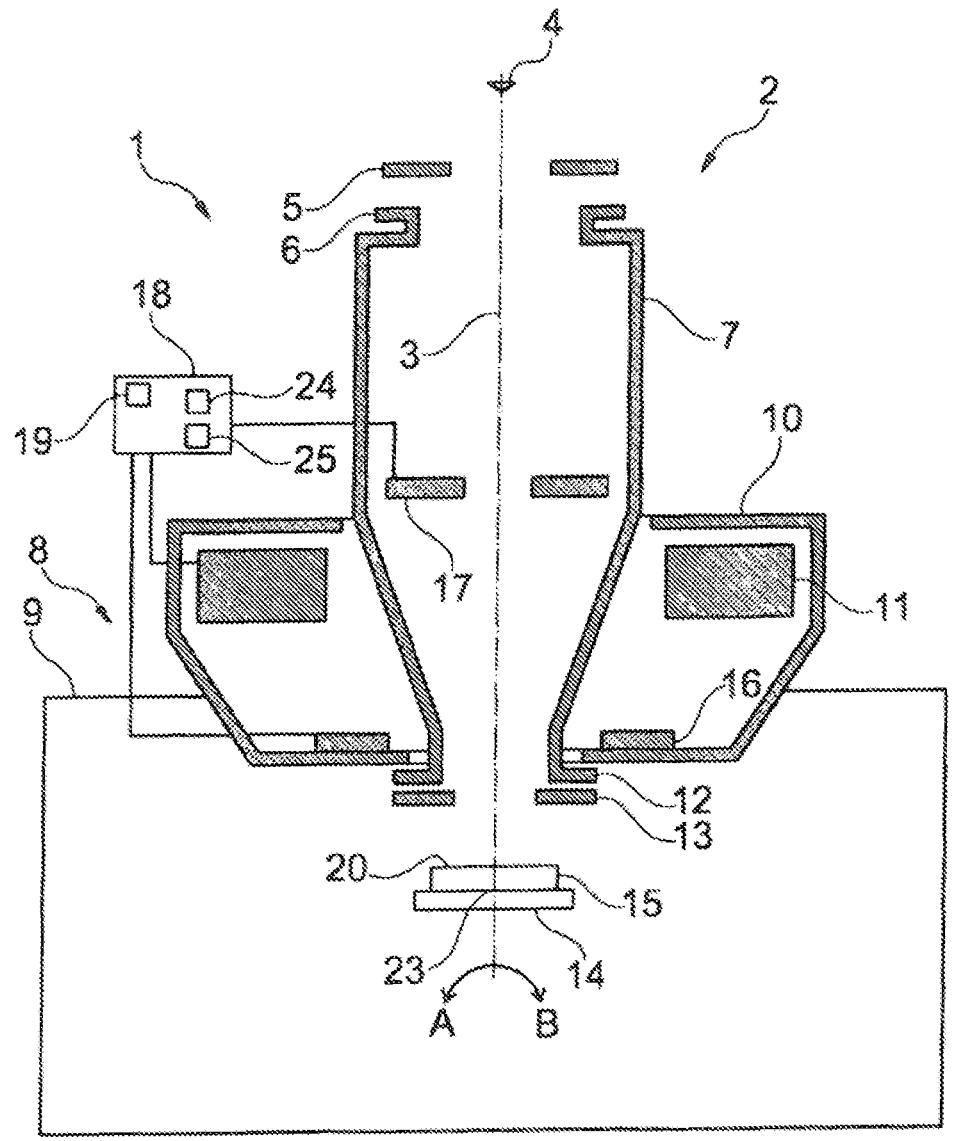
FIG. 1 shows a schematic illustration of a particle beam device in the form of an SEM.

FIG. 1 shows a schematic illustration of a particle beam device 1 in the form of an SEM having a particle beam column 2, which is implemented as an electron beam column. However, it is already expressly to be noted that the system described herein is not restricted to an SEM. Rather, the system described herein is usable in any particle beam device, in particular in an ion beam device.

The particle beam column 2 has an optical axis 3, a beam generator 4 in the form of an electron source (cathode), a first electrode 5 in the form of an extraction electrode, and a second electrode 6 in the form of an anode, which simultaneously forms one end of a beam guiding tube 7. For example, the beam generator 4 is a thermal field emitter. Electrons which exit from the beam generator are accelerated to anode potential as a result of a potential difference between the beam generator 4 and the second electrode 6. A particle beam in the form of an electron beam is accordingly provided.

Furthermore, the particle beam device 1 has an objective lens 8, which protrudes into a sample chamber 9 of the particle beam device 1. The objective lens 8 has a borehole, through which the beam guiding tube 7 is guided. Furthermore, the objective lens 8 is provided with pole pieces 10, in which a coil 11 is arranged. An electrostatic deceleration apparatus is arranged beyond the beam guiding tube 7 along the optical axis 3 in the direction of an object 15. This apparatus has a tube electrode 12, which forms one end of the beam guiding tube 7. Furthermore, the electrostatic deceleration apparatus has an individual electrode 13, which is arranged adjacent to the tube electrode 12 along the optical axis 3. A sample carrier 14, on which the object 15 to be studied and/or processed is arranged, is arranged in the sample chamber 9. The tube electrode 12 is at anode potential jointly with the beam guiding tube 7, while the individual electrode 13 and the object 15 are at a lower potential in relation to the anode potential. In this manner, the electrons of the particle beam can be decelerated to a desired energy, which is required for studying and/or processing the object 15 arranged on the sample carrier 14. For the imaging, secondary electrons and/or backscatter electrons, which arise as a result of the interactions of the particle beam with the object 15, are detected by means of a detector 17 arranged in the beam guiding tube 7. The signals generated by the detector 17 are transmitted for the imaging to an electronics unit 18, which comprises a microprocessor 19, which is implemented for the imaging and relays signals to a display unit 25 in the form of a monitor. In an alternative exemplary embodiment, the detector 17 is arranged at an arbitrary point between the second electrode 6 and the object 15 along the optical axis 3. In still a further alternative exemplary embodiment, a plurality of detectors 17 are arranged at an arbitrary point between the second electrode 6 and the object 15 along the optical axis 3. In particular, it is provided in one exemplary embodiment that the detector 17 is or the detectors 17 are arranged between the individual electrode 13 and the object 15.

The particle beam column 2 additionally has a scanner apparatus 16, by which the particle beam is deflected, so that the particle beam can be scanned over the object 15 arranged on the sample carrier 14. The scanner apparatus 16 is connected to the electronics unit 18 and the microprocessor 19 thereof to control scanning of the particle beam over a scanning surface 20 of the object 15. The scanning surface 20 of the object 15 comprises a plurality of scanning points, to which the particle beam can be guided by means of the scanner apparatus 16.

The objective lens 8 focuses the particle beam onto the scanning surface 20 of the object 15. For this purpose, the coil 11 of the objective lens 8 is connected to the electronics unit 18. The electronics unit 18 activates the coil 11 and therefore ensures focusing of the particle beam onto the scanning surface 20.

Figure 1A:
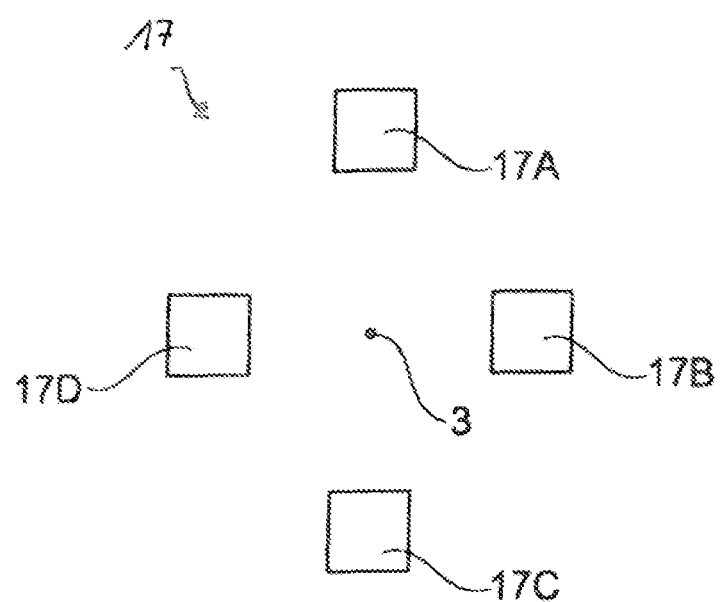
FIG. 1A shows a schematic illustration of an arrangement of detectors.

FIG. 1A schematically shows the arrangement of the detector 17 about the optical axis 3 of the particle beam device 1 in a top view. The detector 17 has four segments, which are each implemented as a detector unit, specifically a first detector unit 17A, a second detector unit 17B, a third detector unit 17C, and a fourth detector unit 17D. The first detector unit 17A, the second detector unit 17B, the third detector unit 17C, and the fourth detector unit 17D are arranged symmetrically about the optical axis 3, specifically respectively offset by 90° relative to one another. Alternatively thereto, it is provided that the above-mentioned detector units 17A to 17D are each implemented as separate detectors. The statements already made above apply with respect to alternative arrangements of the detector 17 (and therefore also of the above-mentioned detector units).

As is apparent from FIG. 1, the sample carrier 14 is implemented so it is rotatable about a rotational axis 23, which is arranged perpendicularly to the optical axis 3 and protrudes into the plane of the page of FIG. 1. The sample carrier 14 can be rotated in the arrow direction A or in the arrow direction B, so that the object 15 and the scanning surface 20 of the object 15 can be moved into a tilted position relative to the optical axis 3 and therefore also to the particle beam generated by the beam generator 4. Alternatively thereto, it is provided that the particle beam is tilted relative to the scanning surface 20 of the object 15, so that (viewed relatively), the scanning surface 20 of the object 15 can assume tilted positions in relation to the particle beam.

Figure 2A:
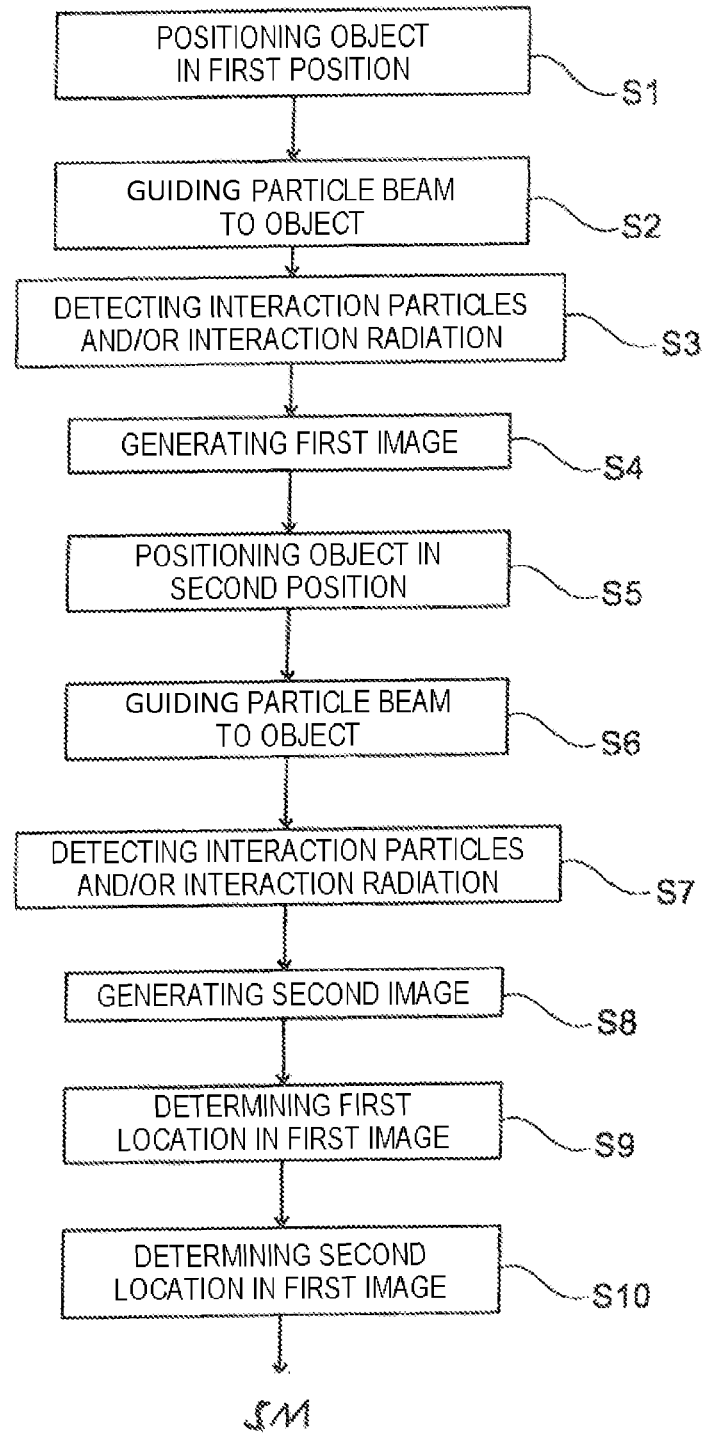
FIG. 2 show flow charts of exemplary embodiments of a method for generating and analyzing a three-dimensional representation.
Figure 2B:
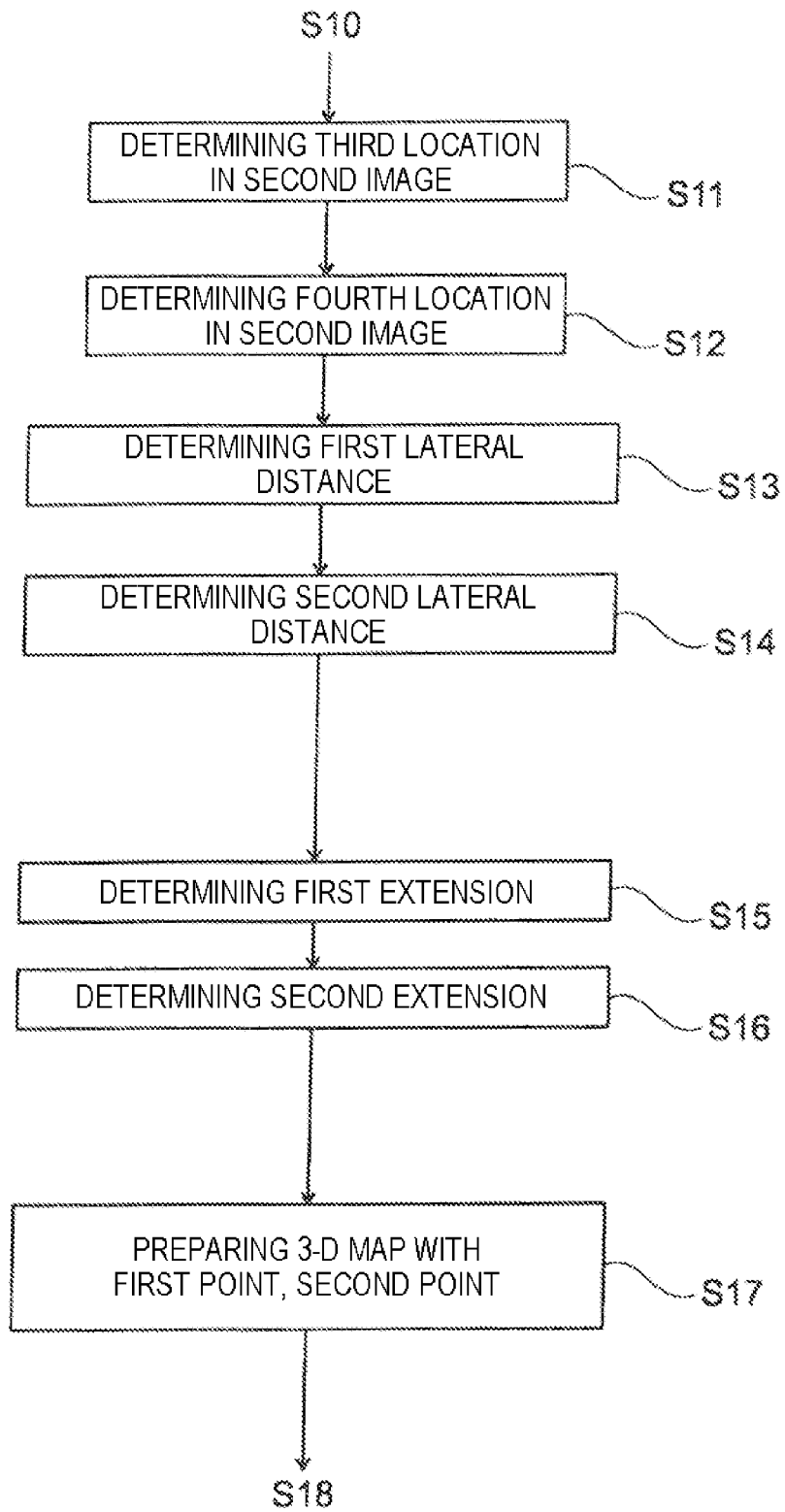
Figure 3A:
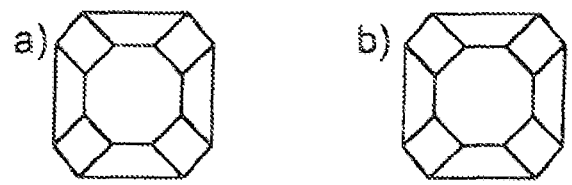
FIG. 3 show illustrations of an object to be studied during the performance of various method steps.

FIGS. 2A and 2B show a flow chart of an exemplary embodiment of the first method part. The object 15 is moved by means of the sample carrier 14 into a first position relative to the particle beam (method step S1). This is performed by tilting the sample carrier 14 in the arrow direction A according to FIG. 1 by approximately 8° with respect to the position shown in FIG. 1. The particle beam is then guided onto the object 15 (method step S2). Interactions in the form of secondary electrons and/or backscatter electrons are detected by means of the detector 17 (method step S3). Alternatively or additionally thereto, it is provided that interaction radiation, which is generated upon the incidence of the particle beam on the object 15, is detected by means of a further detector (not shown). In a further method step S4, a first image of the scanning surface 20 of the object 15 is generated by means of the detection signals obtained in this manner Subsequently thereto, in a method step S5, the sample carrier 14 is rotated in the arrow direction B (FIG. 1) by approximately 16°, in such a manner that it is arranged tilted by approximately 8° in the arrow direction B in relation to the position according to FIG. 1. The object 15 is also arranged accordingly. Further method steps are then carried out. In a method step S6, the particle beam is guided onto the scanning surface 20 of the object 15. The interaction particles in the form of secondary electrons and/or backscatter electrons, which arise upon incidence of the particle beam on the object 15, are detected by means of the detector 17 (method step S7). Alternatively or additionally thereto, interaction radiation can also be detected using a further detector (not shown). A second image of the scanning surface 20 of the object 15 is then generated (method step S8). FIG. 3A shows, on the left side, a schematic illustration of the first image (a) and, on the right side, a schematic illustration of the second image (b).

Figure 3B:
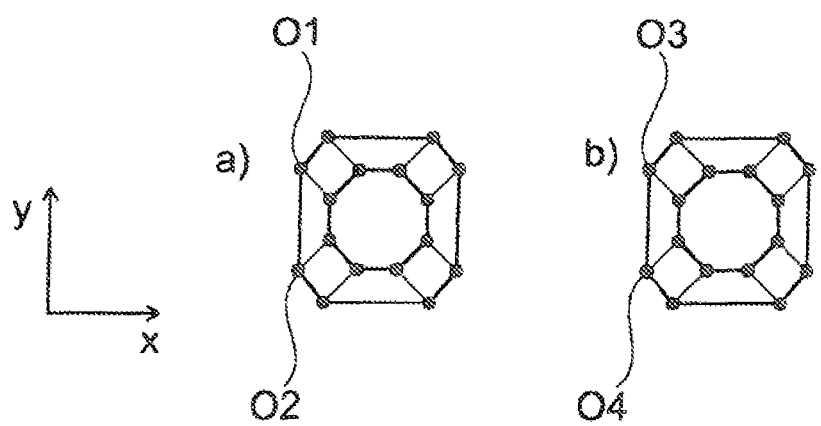

In method steps S9 and S10 which now follow, specific locations in the first image are identified or determined. Thus, at least one first location O1 in the first image is determined, which is provided by a first coordinate along a first coordinate axis (specifically the x-axis) and by a second coordinate along a second coordinate axis (specifically the y-axis). The x-axis is arranged perpendicularly to the y-axis. Furthermore, in a method step S10, at least one second location O2 in the first image is determined, which is provided by a third coordinate along the x-axis and by a fourth coordinate along the y-axis. In FIG. 3B, on the left side, the first image (a) having the determined locations is shown, which are shown as points, wherein, in the illustration shown here, more than two locations are determined and shown (specifically a total of 16 locations).

In method steps S11 and S12, locations are also determined for the second image. Thus, in a method step S11, at least one third location O3 in the second image is determined, which is provided by a fifth coordinate along the x-axis and by a sixth coordinate along the y-axis. In method step S12, at least one fourth location O4 in the second image is determined, wherein the fourth location O4 is provided by a seventh coordinate along the x-axis and by an eighth coordinate along the y-axis. The third location O3 and the fourth location O4 are not arbitrary locations in the second image, however. Rather, the third location O3 in the second image has a very specific relationship to the first location O1 in the first image and the fourth location O4 in the second image has a very specific relationship to the second location O2 in the first image. This is because the third location O3 in the second image corresponds to the first location O1 in the first image. Furthermore, the fourth location O4 in the second image corresponds to the second location O2 in the first image. Therefore, each location determined in the first image corresponds to a location determined in the second image. The corresponding locations are identical and identify a respective position on the surface of the object 15, which is visible firstly in the first image (for example, the first location O1) and secondly in the second image (for example, the third location O3). In FIG. 3B, on the right side, the second image (b) having the corresponding specific locations is shown, wherein, in the illustration shown here, more than two locations (specifically 16 locations) are determined and shown.

In method step S13, a first lateral distance of the first location O1 to the third location O3 is now determined. Furthermore, in a method step S14, a second lateral distance between the second location O2 and the fourth location O4 is determined. In other words, the relative distance (lateral distance) of the same location (the first location O1 and the third location O3 on the one hand, and the second location O2 and the fourth location O4 on the other hand), which is imaged and visible in the two different images (specifically the first image and the second image), is determined. Since the first image and the second image are recorded in different positions relative to the particle beam, the relative distance of the same location in the two different images is not necessarily zero. Rather, it is typically different from zero. Since the first image and the second image are recorded at different tilt positions of the object 15 relative to the optical axis 3 of the particle beam, the result, in general, in the two above-mentioned images, is different distances between the image points, which are associated with the same object points on the surface of the object 15, in the two above-mentioned images, so that, for example, the distance between the first location O1 and the second location O2 in the first image generally differs from the distance between the third location O3 and the fourth location O4 in the second image, even though the first location O1 and the third location O3 correspond to the same object point on the surface of the object 15 and, furthermore, the second location O2 and the fourth location O4 correspond to the same object point on the surface of the object 15. From trigonometric considerations, it is apparent that these distances between identical object points on the surface of the object 15 in the first image and in the second image behave correspondingly to the reciprocal values of the cosine of the respective tilt angle between the surface of the object 15 and the optical axis 3 of the particle beam. If the object points corresponding to the first location O1 and the second location O2 also still have a different height in the direction of the optical axis 3 of the particle beam (third coordinate axis), as a result of a non-level topography of the surface of the object 15, the different tilt angles of the object 15 during the recording of the first image and the second image still result in an additional change of the distances between the first location O1 and the second location O2 in the first image on the one hand, and the third location O3 and the fourth location O4 in the second image on the other hand. The above-mentioned lateral distance corresponds to the difference of the distances between image points, which are associated with identical object points, in the first image and in the second image. These lateral distances can be measured directly between the image points, which are associated with identical object points, in the first image and in the second image or they can be measured as distances of the respective image points in the first image and in the second image relative to an identical image edge in the first image and in the second image. The first lateral distance then corresponds to the distance difference, which the first location O1 in the first image and the third location O3 in the second image have from the same image edge. Accordingly, the second lateral distance corresponds to the distance difference, which the second location O2 in the first image and the fourth location O4 in the second image have from the same image edge.

In a further method step S15, a first extent of the object 15 at the first location O1 along a third coordinate axis (specifically a z-axis) is determined by means of the first lateral distance. The z-axis is arranged both perpendicularly to the x-axis and perpendicularly to the y-axis. In a further method step S16, a second extent of the object 15 at the second location O2 along the z-axis is determined by means of the second lateral distance.

In a further method step S17 which now follows again, a three-dimensional map is prepared, wherein, in the three-dimensional map, the first extent at the first location O1 and the second extent at the second location O2 are recorded. In this way, at least two points P1 and P2 are determined in the three-dimensional map. A first number tuple composed of the coordinates of the first location O1 and the first extent then determines the first point P1. Furthermore, a second number tuple composed of the coordinates of the second location O2 and the first extent determines a second point P2.

Figure 3C:
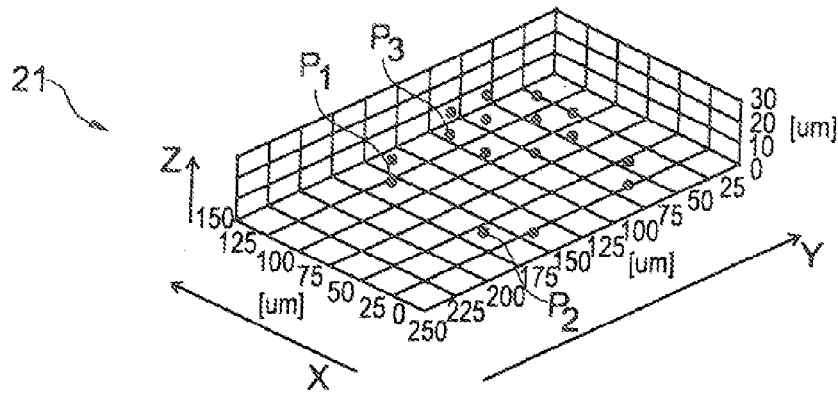
Figure 3D:
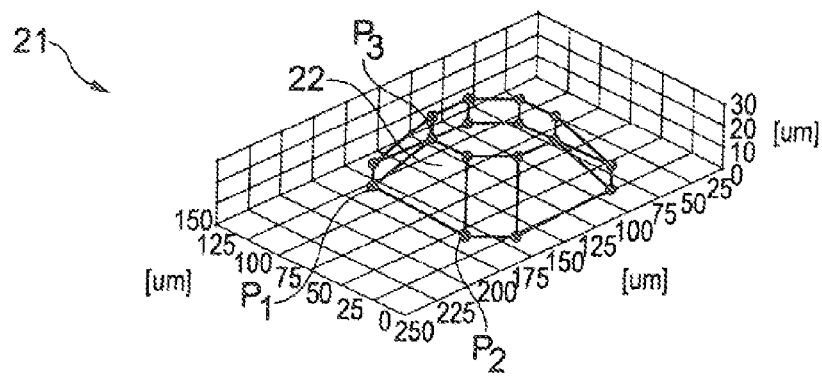

The extent at various locations of the object 15 along the z-axis is shown for various points in a three-dimensional illustration in FIG. 3C. In FIG. 3D, these points of the object 15 are connected to one another by lines, so that an impression of a height profile of the object 15 can be obtained depending on the various points (3-D map 21). However, this does not have to correspond to the actual three-dimensional profile of the surface of the object 15. Rather, the illustration in FIG. 3D is a purely hypothetical illustration of the three-dimensional profile of the surface of the object 15. The lines basically represent interpolated items of height information of the object 15 between the various points of the 3-D map determined in the first method part. The lines are boundary lines of theoretically determined surface segments, which are each adapted by further items of information, which are obtained using the second method part, to the actual object topography.

Figure 2C:
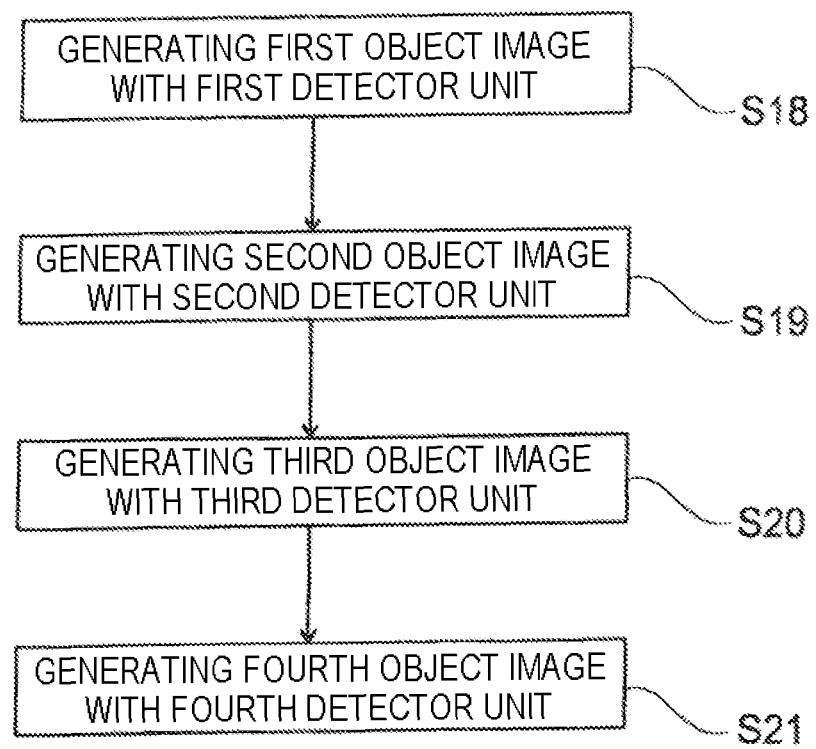
Figure 3E:
Figure 3E:
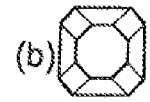
Figure 3E:
Figure 3E:

FIG. 2C now shows method steps of the second method part. The multi-detector method is performed in the particle beam device 1. Thus, in a method step S18, a first object image is generated using the first detector unit 17A. In a method step S19, a second object image is generated using the second detector unit 17B. In still a further method step S20, a third object image is generated using the third detector unit 17C. In still a further method step S21, a fourth object image is generated using the fourth detector unit 17D. Method steps S18 to S21 can certainly be performed in parallel. In other words, the above-mentioned object images can be recorded simultaneously. The particle beam is guided only once over the scanning surface 20 in this exemplary embodiment. The above-mentioned detector units 17A to 17D record the corresponding object image at the same time. FIG. 3E shows the four object images generated by means of the second method part, specifically the first object image (a), the second object image (b), the third object image (c), and the fourth object image (d).

Figure 2D:
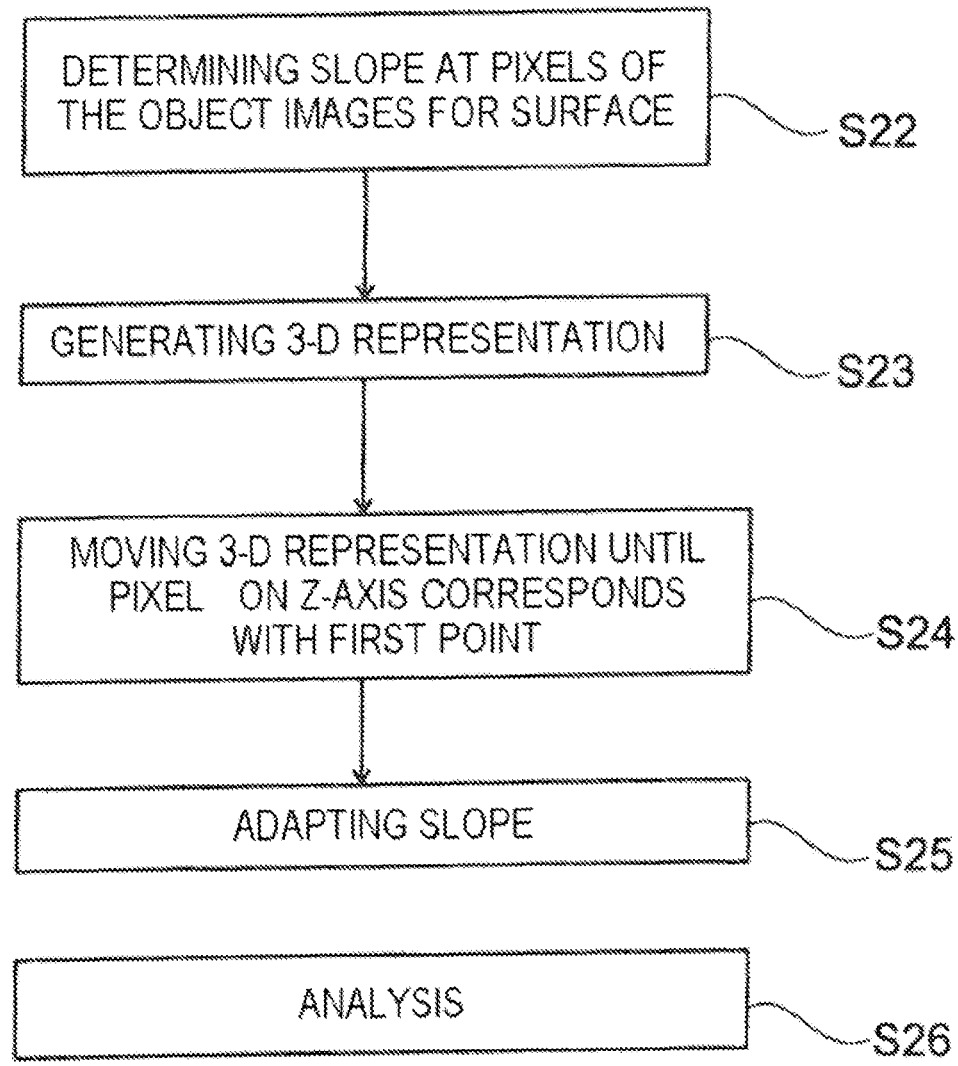
Figure 3F:
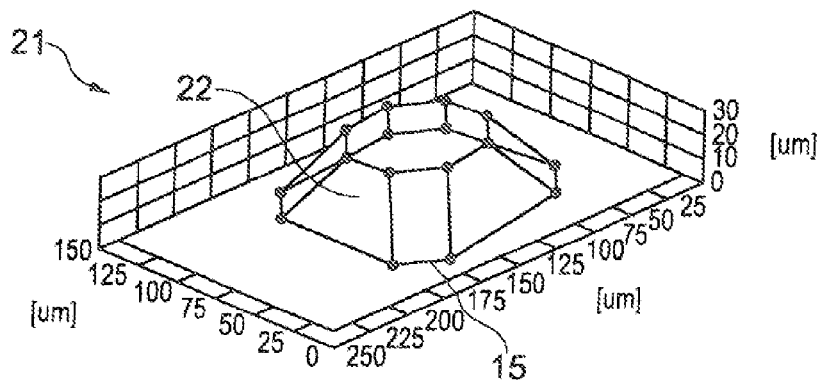
Figure 3G:
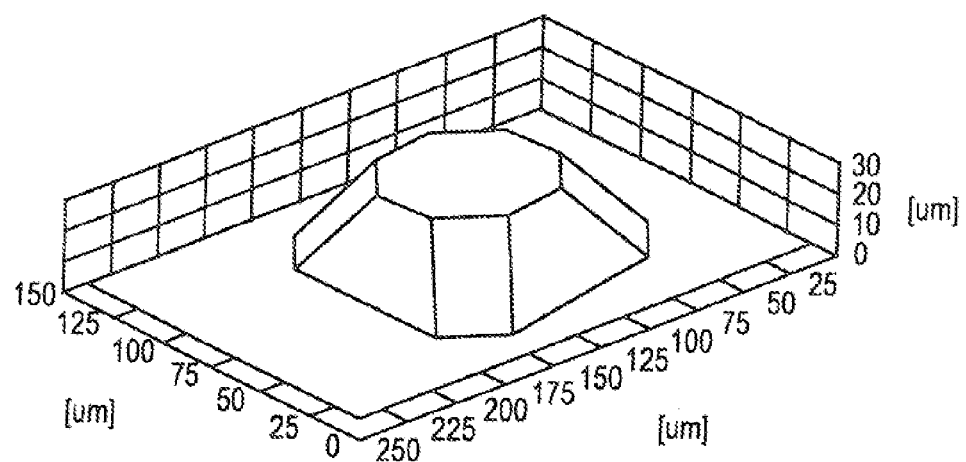

Further method steps of an exemplary embodiment of the second method part are explained hereafter on the basis of FIG. 2D. In method step S22, the slope of the surface of the object 15 is now determined, at the respective pixels of the above-mentioned object images, with the aid of grayscale values at the respective pixels of the above-mentioned object images, which were generated by means of the second method part (see FIG. 3F). This is already known from the prior art. For example, reference is made in this regard to U.S. Pat. No. 5,001,344 A and U.S. Pat. No. 4,912,313 A. To simplify the method, in one exemplary embodiment, it can be provided that only every fifth or every tenth pixel in the above-mentioned object images is to be used for this purpose. By integration of the ascertained slopes, a three-dimensional representation of the object 15 (see FIG. 3G) is then generated in a method step S23. A surface 22, which displays a constant slope over the entire region, is shown on the three-dimensional map of the object 15 shown in FIG. 3F. The integration of this slope on the surface 22 therefore results in an inclined plane.

An exemplary embodiment of the third method part is illustrated in method steps S24 and S25 of FIG. 2D. As already explained above, the three-dimensional representation of the object 15, which is determined using the second method step, is moved along the z-axis until a first pixel of the three-dimensional representation lies on the first point P1. Furthermore, an adaptation of slopes of the three-dimensional representation at a predefined number of pixels of the three-dimensional representation is performed in such a manner that the surface of the object 15 runs through the first point P1 and through the second point P2.

Figure 3H:
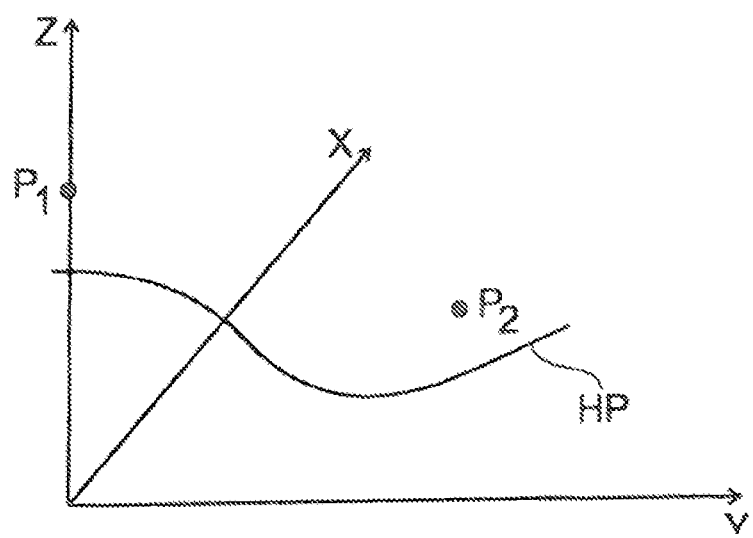

If the points P1 and P2, which are generated using the first method part, and the three-dimensional representation, which is generated using the second method part, are now laid one over another in a coordinate system, a representation as provided by FIG. 3H is typically obtained. The coordinate system is spanned by the first coordinate axis in the form of the x-axis, by the second coordinate axis in the form of the y-axis, and by the third coordinate axis in the form of the z-axis. The above-mentioned three coordinate axes are arranged perpendicularly to one another. The first point P1 and the second point P2 are shown. Furthermore, for reasons of clarity, only one height profile HP of the three-dimensional representation is shown as an example. The height profile HP shown here is the height profile which runs in the plane in which the first point P1 and the second point P2 also lie.

Figure 3I:
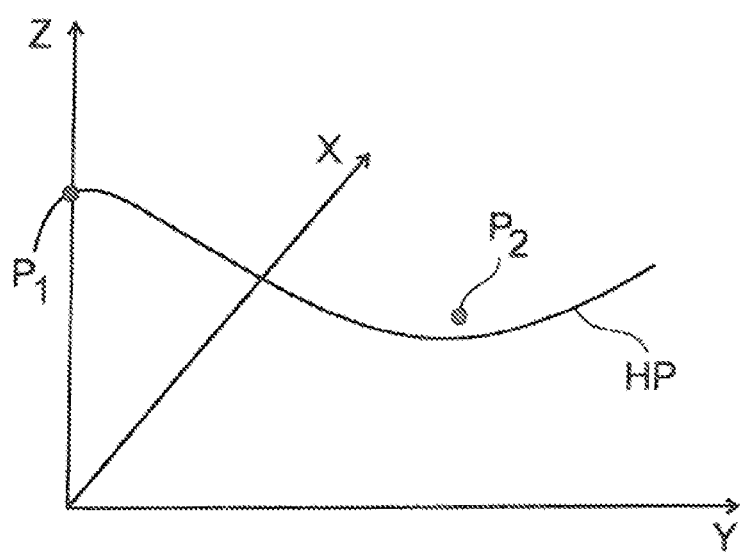
Figure 3J:
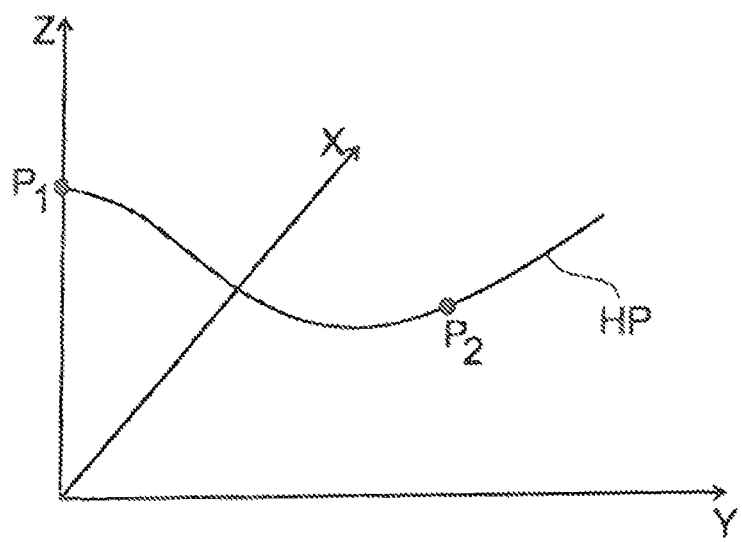

In a method step S24, this height profile HP is now displaced along the third coordinate axis in the form of the z-axis until the height profile HP comes to rest on the first point P1 (see FIG. 3I). Subsequently thereto, in a method step S25, the slopes of the height profile HP are adapted in such a manner that the height profile HP comes to rest on the second point P2 (see FIG. 3J). In other words, the height profile HP is compressed or stretched in such a manner that it comes to rest on the second point P2 (i.e., it runs through the second point P2). The representations selected in FIGS. 3I and 3J are the simplest form of the representation for this part of the system described herein. As already mentioned above, in addition to the first point P1 and the second point P2, numerous points can be determined, which also determine the three-dimensional profile of the surface of the object 15. After the above-explained displacement of the height profile HP, the described compression and stretching of the height profile HP is performed in all three dimensions in such a manner that the height profile HP runs through each of the determined points after the compression and the stretching, i.e., comes to rest thereon. Therefore, the compression and stretching are basically performed in all three dimensions, until the height profile HP runs through each of the determined points.

The exemplary embodiment described here for the adaptation corresponds to a linear transformation, which is provided by the equation $y=ax+b$. The coefficient a is used to adapt the height profile HP to the difference of the points P1 and P2 along the z-axis. The coefficient b can be used to undertake an adaptation along the z-axis.

In a further exemplary embodiment, the adaptation of the height profile HP can be extended over the entire image field. In an alternative exemplary embodiment, it is provided that the adaptation is only carried out in predefined regions of the surface of the object 15.

The sequence of the performance of the first method part and the second method part is not fixed. Thus, firstly the first method part and then subsequently the second method part can be performed. In an alternative embodiment of the method according to the system described herein, it is provided that firstly the second method part and then subsequently the first method part is to be performed. In a further embodiment of the method according to the system described herein, it is alternatively provided that at least some method steps, preferably all method steps, of the first method part and of the second method part are to be executed in parallel to one another with respect to time.

If the object 15 has a plurality of easily identifiable points on the surface thereof, in particular, the embodiment explained hereafter is suitable. Firstly, a plurality of first points P1 and a plurality of second points P2 are determined by means of the first method part. Furthermore, the profile of the surface of the object 15 is determined in a surface region, which is spanned by at least three of the plurality of first points P1 and/or the plurality of second points P2. The above-explained adaptation is performed subsequently thereto.

If the object 15 only has a few easily identifiable points on the surface thereof (for example, because of a very smooth surface), the following embodiment is then carried out, for example. Firstly, the profile of the surface of the object 15 is determined by means of the second method part. Subsequently thereto, the determination of points P1 and P2 is performed by means of the first method part. The transformation already discussed above is then performed.

In a fourth method part, the three-dimensional representation of the object 15, which is calculated in the third method part, is analyzed (method step S26 in FIG. 2D). For example, the three-dimensional representation of the object 15 calculated in the third method part is displayed on the display unit 25 of the particle beam device 1 and/or data of the three-dimensional representation of the object 15, which is calculated in the third method part, are stored in a storage unit 24 of the electronics unit 18. Additionally or alternatively thereto, it is provided that the three-dimensional representation of the object 15, which is calculated in the third method part, is compared to predefined data of the object 15. For example, the predefined data are data which were already obtained by further measurement on the object 15.

Reference is made to the above statements with regard to the advantages.

The system described herein has been principally explained, on the basis of the exemplary embodiment explained in the figures, using a particle beam device which is implemented as an electron beam device. As already mentioned above, the system described herein can also be used on any other particle beam device, thus, for example, also on an ion beam device. An ion beam device is in principle constructed similarly to an electron beam device. However, the ion beam device has, in place of an electron source, an ion source and, in place of magnetic lenses or combined electrostatic-magnetic lenses, only electrostatic lenses. Furthermore, depending on the polarity of the ions, polarities of the potentials and potential differences applied to the various components of the ion beam device are also adapted accordingly.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A method for operating a particle beam device and/or for analyzing an object in the particle beam device, comprising:
   a first method part based on a stereoscopy method and having the following steps:
      positioning the object in a first position relative to a particle beam and guiding the particle beam to the object;
      detecting interaction particles and/or interaction radiation to generate a first image of the object;
      positioning the object in a second position relative to the particle beam and guiding the particle beam to the object;
      detecting interaction particles and/or interaction radiation to generate a second image of the object;
      determining at least one first location in the first image, which is provided by a first coordinate along a first coordinate axis and by a second coordinate along a second coordinate axis, wherein the first coordinate axis and the second coordinate axis enclose a first angle, which is different from 0° or 180°, with one another;
      determining at least one second location in the first image, which is provided by a third coordinate along the first coordinate axis and by a fourth coordinate along the second coordinate axis;
      determining at least one third location in the second image, which is provided by a fifth coordinate along the first coordinate axis and by a sixth coordinate along the second coordinate axis, wherein the third location in the second image corresponds to the first location in the first image;
      determining at least one fourth location in the second image, which is provided by a seventh coordinate along the first coordinate axis and by an eighth coordinate along the second coordinate axis, wherein the fourth location in the second image corresponds to the second location in the first image;
      determining a first lateral distance of the first location to the third location and determining a second lateral distance between the second location and the fourth location;
      determining a first extent of the object at the first location along a third coordinate axis using the first lateral distance and determining a second extent of the object at the second location along the third coordinate axis using the second lateral distance, wherein the third coordinate axis encloses a second angle, which is different from 0° or 180°, with the first coordinate axis, and wherein the third coordinate axis encloses a third angle, which is different from 0° or 180°, with the second coordinate axis; and
      preparing a three-dimensional map, wherein the first extent at the first location and the second extent at the second location are recorded in the three-dimensional map, wherein a first number tuple composed of the coordinates of the first location and the first extent determines a first point, and wherein a second number tuple composed of the coordinates of the second location and the second extent determines a second point;
   a second method part based on a multi-detector method and having the following steps:
      generating a first object image using at least one first detector unit;
      generating a second object image using at least one second detector unit;
      generating a third object image using at least one third detector unit;
      generating a fourth object image using at least one fourth detector unit; and
      determining a profile of a surface of the object and generating a three-dimensional representation of the object using the first object image, the second object image, the third object image, and the fourth object image;

a third method part based on reconciling at least the first point and the second point determined from the first method part with the three dimensional representation of the second method part, the third method part having the following steps:

displacing the three-dimensional representation of the second method part along the third coordinate axis, until a first pixel of the three-dimensional representation of the second method part lies on the first point determined from the first method part; and generating a calculated three-dimensional representation of the object by using at least one transformation process to adapt slopes of the three-dimensional representation of the second method part at a predefined number of pixels of the three-dimensional representation of the second method part in such a manner that the surface of the object runs through the first point determined from the first method part and through the second point determined from the first method part; and a fourth method part having the following step:

analyzing the three-dimensional representation of the object calculated in the third method part.

2. The method according to claim 1, wherein, during the analysis of the three-dimensional representation of the object, which is calculated in the third method part, the three-dimensional representation of the object, which is calculated in the third method part, is displayed on a display unit and/or data of the three-dimensional representation of the object, which is calculated in the third method part, are stored in a storage unit.

3. The method according to claim 1, wherein, during the analysis of the three-dimensional representation of the object, which is calculated in the third method part, the three-dimensional representation of the object, which is calculated in the third method part, is compared to predefined data of the object.

4. The method according to claim 1, wherein a plurality of first points and a plurality of second points are determined using the first method part, and wherein the profile of the surface of the object is determined in a surface region, which is spanned by at least three of the plurality of first points and/or of the plurality of second points.

5. The method according to claim 1, wherein the first coordinate axis, the second coordinate axis, and/or the third coordinate axis are arranged perpendicularly to one another.

6. The method according to claim 1, wherein the first object image, the second object image, the third object image, and the fourth object image are generated simultaneously by scanning a surface of the object using the particle beam.

7. The method according to claim 1, wherein the method further comprises at least one of the following steps:

(i) the first image of the object is generated simultaneously with at least one of the following object images: the first object image, the second object image, the third object image, or the fourth object image, or (ii) the second image of the object is generated simultaneously with at least one of the following object images: the first object image, the second object image, the third object image, or the fourth object image.

8. The method according to claim 1, wherein, in place of the first lateral distance and the second lateral distance, distance differences between image points, which are associated with the same object points, in the first image and in the second image are determined, and wherein the first extent and the second extent of the object are determined on the basis of the previously determined distance differences.

9. A non-transitory computer-readable medium storing software which is executable by a control processor of a particle beam device to perform a method for operating the particle beam device and/or for analyzing an object in the particle beam device, the method comprising:

a first method part based on a stereoscopy method and having the following steps:

positioning the object in a first position relative to a particle beam and guiding the particle beam to the object;

detecting interaction particles and/or interaction radiation to generate a first image of the object;

positioning the object in a second position relative to the particle beam and guiding the particle beam to the object;

detecting interaction particles and/or interaction radiation to generate a second image of the object;

determining at least one first location in the first image, which is provided by a first coordinate along a first coordinate axis and by a second coordinate along a second coordinate axis, wherein the first coordinate axis and the second coordinate axis enclose a first angle, which is different from 0° or 180°, with one another;

determining at least one second location in the first image, which is provided by a third coordinate along the first coordinate axis and by a fourth coordinate along the second coordinate axis;

determining at least one third location in the second image, which is provided by a fifth coordinate along the first coordinate axis and by a sixth coordinate along the second coordinate axis, wherein the third location in the second image corresponds to the first location in the first image;

determining at least one fourth location in the second image, which is provided by a seventh coordinate along the first coordinate axis and by an eighth coordinate along the second coordinate axis, wherein the fourth location in the second image corresponds to the second location in the first image;

determining a first lateral distance of the first location to the third location and determining a second lateral distance between the second location and the fourth location;

determining a first extent of the object at the first location along a third coordinate axis using the first lateral distance and determining a second extent of the object at the second location along the third coordinate axis using the second lateral distance, wherein the third coordinate axis encloses a second angle, which is different from 0° or 180°, with the first coordinate axis, and wherein the third coordinate axis encloses a third angle, which is different from 0° or 180°, with the second coordinate axis; and preparing a three-dimensional map, wherein the first extent at the first location and the second extent at the second location are recorded in the three-dimensional map, wherein a first number tuple composed of the coordinates of the first location and the first extent determines a first point, and wherein a second number tuple composed of the coordinates of the second location and the second extent determines a second point;

a second method part based on a multi-detector method and having the following steps:

generating a first object image using at least one first detector unit;

generating a second object image using at least one second detector unit;

generating a third object image using at least one third detector unit;

generating a fourth object image using at least one fourth detector unit; and determining a profile of a surface of the object and generating a three-dimensional representation of the object using the first object image, the second object image, the third object image, and the fourth object image;

a third method part based on reconciling at least the first point and the second point determined from the first method part with the three dimensional representation of the second method part, the third method part having the following steps:

displacing the three-dimensional representation of the second method part along the third coordinate axis, until a first pixel of the three-dimensional representation of the second method part lies on the first point determined from the first method part; and generating a calculated three-dimensional representation of the object by using at least one transformation process to adapt slopes of the three-dimensional representation of the second method part at a predefined number of pixels of the three-dimensional representation of the second method part in such a manner that the surface of the object runs through the first point determined from the first method part and through the second point determined from the first method part; and a fourth method part having the following step:

analyzing the three-dimensional representation of the object calculated in the third method part.

10. The non-transitory computer-readable medium according to claim 9, wherein, during the analysis of the three-dimensional representation of the object, which is calculated in the third method part, at least one of the following is performed:

(i) the three-dimensional representation of the object, which is calculated in the third method part, is displayed on a display unit;

(ii) data of the three-dimensional representation of the object, which is calculated in the third method part, are stored in a storage unit; or (iii) the three-dimensional representation of the object, which is calculated in the third method part, is compared to predefined data of the object.

11. The non-transitory computer-readable medium according to claim 9, wherein the method further comprises at least one of the following steps:

(i) the first image of the object is generated simultaneously with at least one of the following object images: the first object image, the second object image, the third object image, or the fourth object image, or (ii) the second image of the object is generated simultaneously with at least one of the following object images: the first object image, the second object image, the third object image, or the fourth object image.

12. A particle beam device, comprising:

at least one beam generator for generating a particle beam;

at least one objective lens for focusing the particle beam on an object;

at least one detector for detecting interaction particles and/or interaction radiation, which are/is generated upon incidence of the particle beam on an object; and at least one control processor that executes software stored on a non-transitory computer readable medium to perform a method for operating the particle beam device and/or for analyzing the object in the particle beam device, the method comprising:

a first method part based on a stereoscopy method and having the following steps:

positioning the object in a first position relative to a particle beam and guiding the particle beam to the object;

detecting interaction particles and/or interaction radiation to generate a first image of the object;

positioning the object in a second position relative to the particle beam and guiding the particle beam to the object;

detecting interaction particles and/or interaction radiation to generate a second image of the object;

determining at least one first location in the first image, which is provided by a first coordinate along a first coordinate axis and by a second coordinate along a second coordinate axis, wherein the first coordinate axis and the second coordinate axis enclose a first angle, which is different from 0° or 180°, with one another;

determining at least one second location in the first image, which is provided by a third coordinate along the first coordinate axis and by a fourth coordinate along the second coordinate axis;

determining at least one third location in the second image, which is provided by a fifth coordinate along the first coordinate axis and by a sixth coordinate along the second coordinate axis, wherein the third location in the second image corresponds to the first location in the first image;

determining at least one fourth location in the second image, which is provided by a seventh coordinate along the first coordinate axis and by an eighth coordinate along the second coordinate axis, wherein the fourth location in the second image corresponds to the second location in the first image;

determining a first lateral distance of the first location to the third location and determining a second lateral distance between the second location and the fourth location;

determining a first extent of the object at the first location along a third coordinate axis using the first lateral distance and determining a second extent of the object at the second location along the third coordinate axis using the second lateral distance, wherein the third coordinate axis encloses a second angle, which is different from 0° or 180°, with the first coordinate axis, and wherein the third coordinate axis encloses a third angle, which is different from 0° or 180°, with the second coordinate axis; and preparing a three-dimensional map, wherein the first extent at the first location and the second extent at the second location are recorded in the three-dimensional map, wherein a first number tuple composed of the coordinates of the first location and the first extent determines a first point, and wherein a second number tuple composed of the coordinates of the second location and the second extent determines a second point;

a second method part based on a multi-detector method and having the following steps:
generating a first object image using at least one first detector unit;
generating a second object image using at least one second detector unit;
generating a third object image using at least one third detector unit;
generating a fourth object image using at least one fourth detector unit; and
determining a profile of a surface of the object and generating a three-dimensional representation of the object using the first object image, the second object image, the third object image, and the fourth object image;

a third method part based on reconciling at least the first point and the second point determined from the first method part with the three dimensional representation of the second method part, the third method part having the following steps:
displacing the three-dimensional representation of the second method part along the third coordinate axis, until a first pixel of the three-dimensional representation of the second method part lies on the first point determined from the first method part; and
generating a calculated three-dimensional representation of the object by using at least one transformation process to adapt slopes of the three-dimensional representation of the second method part at a predefined number of pixels of the three-dimensional representation of the second method part in such a manner that the surface of the object runs through the first point determined from the first method part and through the second point determined from the first method part; and a fourth method part having the following step:
analyzing the three-dimensional representation of the object calculated in the third method part.

13. The particle beam device according to claim 12, further comprising:
a display unit, wherein, during the analysis of the three-dimensional representation of the object, which is calculated in the third method part, the three-dimensional representation of the object, which is calculated in the third method part, is displayed on the display unit.

14. The particle beam device according to claim 12, further comprising:
a storage unit, wherein, during the analysis of the three-dimensional representation of the object, which is calculated in the third method part, data of the three-dimensional representation of the object, which is calculated in the third method part, are stored in the storage unit.

15. The particle beam device according to claim 12, wherein, during the analysis of the three-dimensional representation of the object, which is calculated in the third method part, the three-dimensional representation of the object, which is calculated in the third method part, is compared to predefined data of the object.

16. The particle beam device according to claim 12, wherein a plurality of first points and a plurality of second points are determined using the first method part, and wherein the profile of the surface of the object is determined in a surface region, which is spanned by at least three of the plurality of first points and/or of the plurality of second points.

17. The particle beam device according to claim 12, wherein the first coordinate axis, the second coordinate axis, and/or the third coordinate axis are arranged perpendicularly to one another.

18. The particle beam device according to claim 12, wherein the first object image, the second object image, the third object image, and the fourth object image are generated simultaneously by scanning a surface of the object using the particle beam.

19. The particle beam device according to claim 12, wherein the method further comprises at least one of the following steps:
(i) the first image of the object is generated simultaneously with at least one of the following object images: the first object image, the second object image, the third object image, or the fourth object image, or
(ii) the second image of the object is generated simultaneously with at least one of the following object images: the first object image, the second object image, the third object image, or the fourth object image.

20. The particle beam device according to claim 12, wherein, in place of the first lateral distance and the second lateral distance, distance differences between image points, which are associated with the same object points, in the first image and in the second image are determined, and wherein the first extent and the second extent of the object are determined on the basis of the previously determined distance differences.

21. The particle beam device according to claim 12, wherein the at least one transformation process includes at least one of: a linear transformation, a non-linear transformation, a regression method, or a weighted average.

22. The method according to claim 1, wherein the at least one transformation process includes at least one of: a linear transformation, a non-linear transformation, a regression method, or a weighted average.

23. The non-transitory computer-readable medium according to claim 9, wherein the at least one transformation process includes at least one of: a linear transformation, a non-linear transformation, a regression method, or a weighted averaging.

* * * * *